United States Patent

Robello et al.

[11] Patent Number: 5,998,088
[45] Date of Patent: Dec. 7, 1999

[54] HETEROGENEOUS IMAGE LAYER FOR LASER ABLATIVE IMAGING

[75] Inventors: Douglas R. Robello, Webster, N.Y.; Michael T. Swanson, Peoria, Ill.

[73] Assignee: Eastman Kodak Company, Rochester, N.Y.

[21] Appl. No.: 09/128,165

[22] Filed: Aug. 3, 1998

[51] Int. Cl.$^6$ ........................................................ G03C 5/16
[52] U.S. Cl. ........................ 430/269; 430/200; 430/201; 430/945; 430/270.1; 503/227; 427/162; 427/164; 427/385.5
[58] Field of Search ............................. 503/227; 430/269, 430/200, 201, 945, 270.1; 427/385.5, 162, 164

[56] References Cited

U.S. PATENT DOCUMENTS

| | | | |
|---|---|---|---|
| 5,468,591 | 11/1995 | Pearce et al. | 430/200 |
| 5,576,144 | 11/1996 | Pearce et al. | 430/270.15 |
| 5,712,079 | 1/1998 | Robello et al. | 430/270.1 |

*Primary Examiner*—Martin Angebranndt
*Attorney, Agent, or Firm*—Harold E. Cole

[57] ABSTRACT

A laser ablative recording element comprising a support having thereon a recording layer comprising a pigment dispersed in a polymeric binder, the polymeric binder having an infrared-absorbing material dissolved therein, and wherein the polymeric binder is obtained from an aqueous latex dispersion of a polycyanoacrylate copolymer having the formula:

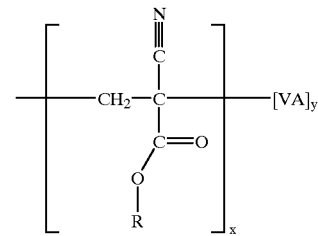

wherein:

R is a substituted or unsubstituted alkyl group having from 1 to about 20 carbon atoms;

VA is a repeating unit resulting from the polymerization of a vinyl-containing monomer with a pendant ionizable group; and the weight ratios of x:y range from about 97:3 to about 70:30.

10 Claims, No Drawings

HETEROGENEOUS IMAGE LAYER FOR LASER ABLATIVE IMAGING

FIELD OF THE INVENTION

This invention relates to laser ablative imaging, and more particularly to the use of a heterogeneous image layer in a laser ablative recording element.

BACKGROUND OF THE INVENTION

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off substantially all of the image dye and binder at the spot where the laser beam hits the element. In ablative imaging, the laser radiation causes rapid local changes in the imaging layer thereby causing the material to be ejected from the layer. Ablation imaging is distinguishable from other material transfer techniques in that some sort of chemical change (e.g., bond-breaking), rather than a completely physical change (e.g., melting, evaporation or sublimation), causes an almost complete transfer of the image dye rather than a partial transfer. The transmission Dmin density value serves as a measure of the completeness of image dye removal by the laser.

DESCRIPTION OF RELATED ART

U.S. Pat. No. 5,576,144 relates to a vinyl polymer binder for an image-recording layer which may be a cyanoacrylate for a recording element. However, the image-recording layer of dye and binder is coated from organic solutions to produce a homogeneous layer. There is a problem with this recording layer in that a substantial amount of energy is required during imaging to remove the recording layer. In addition, because the homogeneous image layer contains high concentrations of molecularly dispersed dyes, under certain conditions of storage, these compounds may separate from the binder in the form of crystals. Further, since the dyes are molecularly dispersed, they can diffuse easily into other layers or out of the coating. Also, since organic solvents are used in coating, there are also environmental concerns with such a process.

U.S. Pat. No. 5,712,079 relates to a barrier layer for laser ablative imaging prepared from an aqueous latex dispersion of a polycyanoacrylate copolymer. The recording layer is similar to the one of the '144 patent described above and has the same problems.

It is an object of this invention to provide a laser ablative recording element that can be more easily ablated in order to decrease the exposure energy required and increase the throughput of the process. It is another object of this invention to provide a laser ablative recording element that does not employ organic solvents during coating.

SUMMARY OF THE INVENTION

These and other objects are achieved in accordance with the invention which comprises a laser ablative recording element comprising a support having thereon a recording layer comprising a pigment dispersed in a polymeric binder, the polymeric binder having an infrared-absorbing material dissolved therein, and wherein the polymeric binder is obtained from an aqueous latex dispersion of a polycyanoacrylate copolymer having the formula:

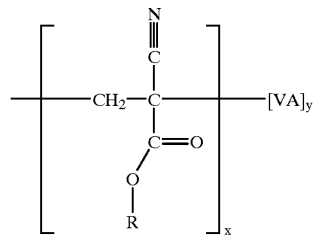

wherein:

R is a substituted or unsubstituted alkyl group having from 1 to about 20 carbon atoms, such as isopropyl, allyl, butyl, iso-butyl, tert-butyl, 2-methoxyethyl, 2-ethoxyethyl, hexyl, 2-ethylhexyl, etc.;

VA is a repeating unit resulting from the polymerization of a vinyl-containing monomer, such as methacrylic acid, acrylic acid, vinyl phosphonic acid, vinyl sulfonic acid, sodium styrene sulfonate, vinyl pyridine, 2-acrylamido-2-methylpropane sulfonic acid, 2-(N,N, N-trimethylammonium)ethyl methacrylate chloride, 2-(N,N-diethylamino)ethyl methacrylate, etc.; said monomer having a pendant ionizable group, such as carboxylic acid, sulfonic acid, phosphonic acid, trialkylammonium, alkyl amine, etc.; and the weight ratios of x:y range from about 97:3 to about 70:30.

Another embodiment of the invention relates to a process of preparing the laser ablative recording element described above comprising:

a) preparing an aqueous latex dispersion of a polycyanoacrylate copolymer and an infrared-absorbing material;

b) preparing an aqueous pigment dispersion;

c) mixing the dispersions from a) and b) together; and d) coating a support with the mixture.

It has been found that a heterogeneous recording layer is superior to a homogeneous one in that significantly less energy is required to ablate the same quantity of material. In a homogeneous recording layer, the laser heats the combination of binder, IR-absorber and imaging dye. In a heterogeneous recording layer of the invention, the laser is concentrated on the binder and IR-absorber since the pigment is in a separate phase and not heated by the laser. Thus the laser can be used more efficiently.

Further, the heterogeneous recording layer of the invention is more stable in keeping since the pigments employed are already crystalline solids (i.e., finely divided), representing a second phase in the heterogeneous coating, and cannot crystallize further. In addition, migration of the pigment is inhibited. The coating process is also more environmentally friendly to manufacture than the prior art elements.

DETAILED DESCRIPTION OF THE INVENTION

In a preferred embodiment of the invention, VA is—$CH_2CR^1$ (COOH)—, wherein $R^1$ is hydrogen or methyl.

In another preferred embodiment, the aqueous latex dispersion of a polycyanoacrylate copolymer and an infrared-absorbing material is prepared by:

a) dissolving said copolymer and said infrared-absorbing material in an organic solvent, b) dispersing the solution in water with agitation, and c) removing said organic solvent.

In still another preferred embodiment, a base is added during step b). In yet still another preferred embodiment, a surfactant is added during step b). In yet another preferred embodiment, the pendant ionizable group is a carboxylic acid, sulfonic acid or phosphonic acid.

A polycyanoacrylate (PCA) recording layer for laser ablative imaging elements is produced, according to this invention, by coating the material in the form of an aqueous latex, with optionally a small amount of organic solvent added as a coalescing aid to promote film formation. This coating process reduces hazardous emissions and eliminates the danger of fire which is present when conventional solvents are used.

The binder in the recording layer of the invention may be used at a coverage of from about 0.1 to about 5 g/m².

Further, the PCA material of this invention is self-dispersing so that an additional surfactant may not be needed. An IR-absorbing dye, which is necessary for laser ablative imaging, is directly incorporated into the latex, so that the film will absorb IR light from the laser and will be ablated in the imaging step. Typical IR-absorbing dyes include cyanine infrared-absorbing dyes as described in U.S. Pat. No. 4,973,572, or other materials as described in the following U.S. Pat. Nos.: 4,948,777; 4,950,640; 4,950,639; 4,948,776; 4,948,778; 4,942,141; 4,952,552; 5,036,040; and 4,912,083, the disclosures of which are hereby incorporated by reference. The IR-absorbing dye can be present in the recording layer at between 2 and 60 wt-%, relative to the PCA binder, and preferably between 10 and 30 wt-%.

The molecular weights of the PCA copolymers described above may be between 1,000 and 2,000,000 weight average molecular weight (polystyrene equivalent by size exclusion chromatography). Particularly good results have been obtained with polymers having a molecular weight between 2,000 and 500,000 weight average.

The cyanoacrylate monomers described above may also be copolymerized with other monomers. For example, the PCA copolymers may comprise copolymers of at least 50 wt. %, preferably more than 75 wt. %, of repeating units as described above along with other vinyl monomers such as acrylates and methacrylates, acrylamides and methacrylamides, vinyl ethers, vinyl alkyl esters, maleic anhydrides, maleimides, itaconic acid and esters, fumaric acid and esters, etc.

Examples of PCA copolymers useful in the invention include the following:

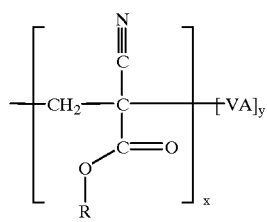

| Compound | R | VA | x | y |
|---|---|---|---|---|
| 1 | $CH_3$ | —$CH_2$—$CH$—<br>              $\|$<br>              C=O<br>              $\|$<br>              OH | 90 | 10 |
| 2 | $CH_2CH_3$ | —$CH_2$—$CH$—<br>              $\|$<br>              C=O<br>              $\|$<br>              OH | 95 | 5 |

-continued
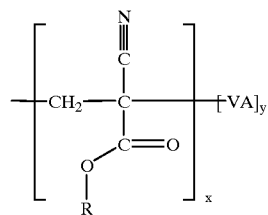
| Compound | R | VA | x | y |
|---|---|---|---|---|
| 3 | $CH_3$ | $-CH_2-C(CH_3)(COOH)-$ | 95 | 5 |
| 4 | $CH_2CH_3$ | $-CH_2-C(CH_3)(COOH)-$ | 70 | 30 |
| 5 | $CH_2CH_3$ | $-CH_2-CH(COOH)-$ | 80 | 20 |
| 6 | $CH_2CH_2OCH_3$ | $-CH_2-C(CH_3)(COOH)-$ | 95 | 5 |
| 7 | $CH_2CH_2OCH_2CH_3$ | $-CH_2-CH(COOH)-$ | 75 | 25 |
| 8 | $CH_2CH_2OCH_2CH_3$ | $-CH_2-C(CH_3)(COOH)-$ | 95 | 5 |
| 9 | $CH_3$, $CH_2CH_3$ (copolymer) | $-CH_2-CH(COOH)-$ | 74:21 | 5 |

-continued

[structure: polymer with -CH2-C(CN)(COOR)- unit (subscript x) and -[VA]- unit (subscript y)]

| Compound | R | VA | x | y |
|---|---|---|---|---|
| 10 | CH₃CH₂CH₃ (copolymer) | -CH₂-C(CH₃)(C(=O)OH)- | 73:21 | 6 |
| 11 | CH₂CH₂CH₃ | -CH₂-CH(C(=O)NH-CH₂-C(CH₃)₂-S(=O)₂-OH)- | 90 | 10 |
| 12 | CH₂CH₂CH₂CH₃ | -CH₂-C(CH₃)(C(=O)-O-CH₂-CH₂-N⁺(CH₃)₃ Cl⁻)- | 85 | 15 |
| 13 | CH₂CH(CH₃)₂ | -CH₂-C(CH₃)(C(=O)-O-CH₂-CH₂-N(CH₂CH₃)(CH₂CH₃))- | 80 | 20 |
| 14 | CH₂CH(CH₂CH₃)—CH₂CH₂CH₂CH₃ | -CH₂-CH(P(=O)(OH)(OH))- | 97 | 3 |

-continued $$\left[ -CH_2-\underset{\underset{R}{\overset{C=O}{|}}}{\overset{\overset{N}{\overset{|||}{C}}}{C}} \right]_x [VA]_y$$

| Compound | R | VA | x | y |
|---|---|---|---|---|
| 15 | $CH(CH_3)_2$ | $-CH_2-\underset{\underset{OH}{\overset{\|}{O=S=O}}}{CH}-$ | 90 | 10 |

16

$$-[H_2C-\underset{\underset{\underset{CH_3}{|}}{\underset{O}{|}}}{\underset{\underset{CH_2}{|}}{\underset{CH_2}{|}}}{\underset{C=O}{|}}]_{60} -[CH_2-\underset{\underset{\underset{CH_3}{|}}{\underset{CH_2}{|}}}{\underset{\underset{CH_2}{|}}{\underset{CH_2}{|}}}{\underset{C=O}{|}}]_{25} -[CH_2-\underset{\underset{OH}{|}}{\underset{C=O}{|}}{\underset{CH_3}{|}}]_{15}-$$

Another embodiment of the invention relates to a process of forming a single color, ablation image comprising image-wise heating by means of a laser, an ablative recording element described above, the laser exposure taking place through the colorant side of the element, and removing the ablated material, such as by means of an air stream, to obtain an image in the ablative recording element.

A barrier layer may be employed in the invention between the support and the recording layer. Suitable materials include those found in U.S. Pat. Nos. 5,712,079 and 5,468,591, the disclosures of which are hereby incorporated by reference.

The ablation elements of this invention can be used to obtain medical images, reprographic masks, printing masks, etc. The image obtained can be a positive or a negative image.

The invention is especially useful in making reprographic masks which are used in publishing and in the generation of printed circuit boards. The masks are placed over a photo-sensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high UV Dmax. If it does not do this, the printing plate would not be developable to give regions which take up ink and regions which do not.

To obtain a laser-induced, ablative image using the process of the invention, a diode laser is preferably employed since it offers substantial advantages in terms of its small size, low cost, stability, reliability, ruggedness, and ease of modulation. Lasers which can be used in the invention are available commercially. There can be employed, for example, Laser Model SDL-2420-H2 from Spectra Diode Labs, or Laser Model SLD 304 V/W from Sony Corp.

As noted above, the laser exposure in the process of the invention takes place through the recording layer side of the ablative recording element, which enables this process to be a single-sheet process, i.e., a separate receiving element is not required.

Pigments employed in this invention are selected to achieve the light absorbance required for the anticipated application, as described above. For example, UV absorbing compounds are employed for printing plate masks. It is occasionally desirable to include pigments that absorb visible wavelengths so that the image is clearly visible to the operator for inspection, alignment, etc. Combinations of pigments are specifically contemplated to achieve the required absorption profile.

In this invention, the pigments are supplied in the form of finely divided solids, i.e., dispersions. These pigment dispersions are conveniently prepared by techniques well known in the art, including ball-milling, grinding, etc. Particularly fine pigment dispersions can be obtained using polymeric milling media, as described in U.S. Pat. Nos. 5,478,705 and 5,679,138.

Any pigment can be used in the image recording layer employed in the invention provided it is insoluble in water, can be dispersed into suitably fine particles, and be ablated by the action of the laser. Pigments which may be used include organic pigments such as metal phthalocyanines, e.g., copper phthalocyanine, quinacridones, epindolidiones, Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Monstral® Blue G (C.I. No. Pigment Blue 15); Monstral® Blue BT 383D (C.I. No. Pigment Blue 15); Monstral® Blue G BT 284D (C.I. No. Pigment Blue 15); Monstral® Green GT 751D (C.I. No. Pigment Green 7) or any of the materials disclosed in U.S. Pat. Nos.: 5,171,650; 5,672,458 or 5,516,622, the disclosures of which are hereby incorporated by reference.

In addition, compounds which are soluble in organic solvents and known in the art as dyes, can be used in this invention provided they are insoluble in water and can be dispersed into suitably fine particles. Thus, these compounds function as pigments in this invention.

Examples of such compounds include Sumikaron Violet RS™ (Sumitomo Chemical Co., Ltd.), Dianix Fast Violet 3R-FS™ (Mitsubishi Chemical Industries, Ltd.), and Kayalon Polyol Brilliant Blue N-BGM and KST Black 146™ (Nippon Kayaku Co., Ltd.); Kayalon Polyol Brilliant Blue BM™, Kayalon Polyol Dark Blue 2BM™, and KST Black KR™ (Nippon Kayaku Co., Ltd.), Sumikaron Diazo Black 5G™ (Sumitomo Chemical Co., Ltd.), and Miktazol Black 5GH™ (Mitsui Toatsu Chemicals, Inc.); Direct Dark Green B™ (Mitsubishi Chemical Industries, Ltd.) and Direct Brown M™ and Direct Fast Black D™ (Nippon Kayaku Co. Ltd.); Kayanol Milling Cyanine 5R™ (Nippon Kayaku Co. Ltd.); Sumiacryl Blue 6G™ (Sumitomo Chemical Co., Ltd.), and Aizen Malachite Green™ (Hodogaya Chemical Co., Ltd.); or any of the colored materials disclosed in U.S. Pat. Nos.: 4,541,830; 4,698,651; 4,695,287; 4,701,439; 4,757,046; 4,743,582; 4,769,360; and 4,753,922, the disclosures of which are hereby incorporated by reference.

The above compounds may be employed singly or in combination. The compounds may be used at a coverage of from about 0.05 to about 1 g/m$^2$.

The recording layer of the ablative recording element employed in the invention may be coated on the support or printed thereon by a printing technique such as a gravure process.

Any material can be used as the support for the ablative recording element employed in the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. In a preferred embodiment, the support is transparent.

The following examples are provided to illustrate the invention.

EXAMPLES

The following materials were employed in the examples:

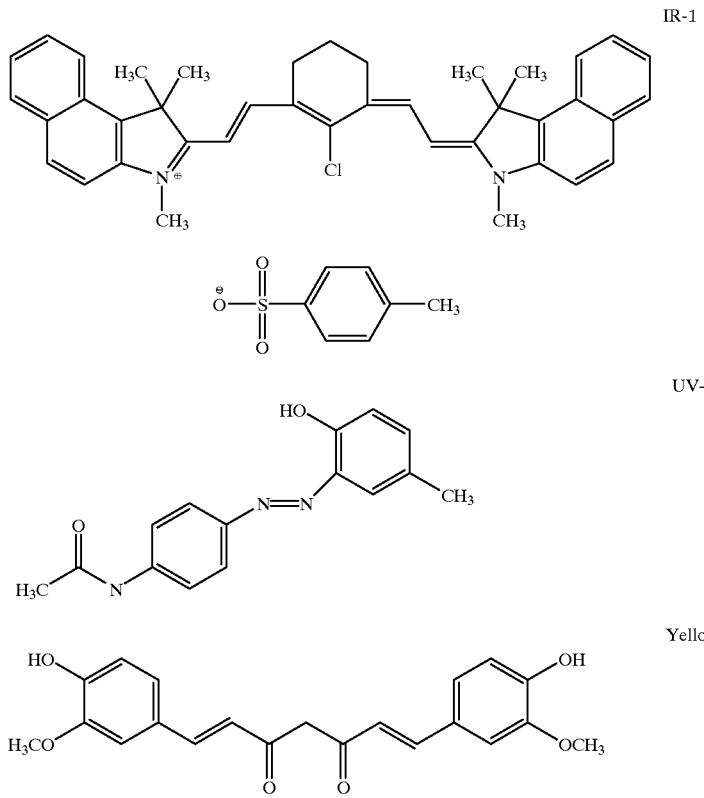

-continued

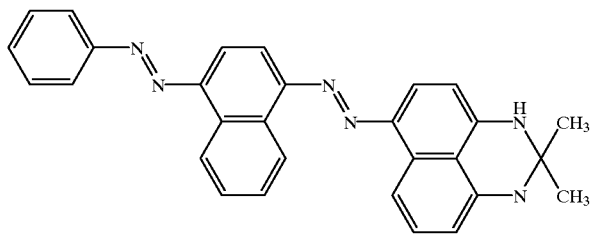

Cyan-1

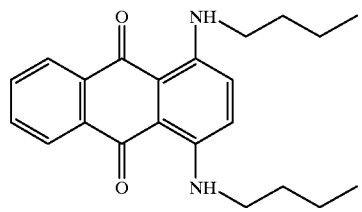

Cyan-2

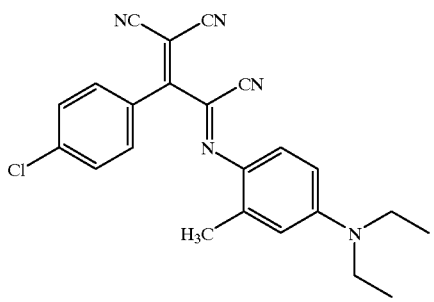

Cyan-3

All image recording layers were coated onto a 100 μm poly(ethylene terephthalate) support that had been pre-coated with a barrier layer of methyl cyanoacrylate/ethyl cyanoacrylate copolymer+IR-1 according to U.S. Pat. No. 5,468,591.

Comparative Example 1

Solvent-based Coating of Image Recording Layer Containing Nitrocellulose Binder

The substrate was coated with a solution of dyes and binder in 80% 4-methyl-2-pentanone/20% ethanol using a syringe-fed semi-automatic system to obtain a layer containing the following ingredients:

|  | mg/ft$^2$ |
| --- | --- |
| Nitrocellulose | 40.40 |
| IR-1 | 16.16 |
| UV-1 | 32.00 |
| Yellow-1 | 12.50 |
| Cyan-1 | 22.00 |

Comparative Example 2

Solvent-based Coating of Image Recording Layer Containing Cyanoacrylate Binder

The substrate was machine-coated with a solution of dyes and binder in 80% 4-methyl-2-pentanone/20% ethanol to obtain a layer containing the following ingredients:

|  | mg/ft$^2$ |
| --- | --- |
| Poly(2-methoxyethyl cyanoacrylate) | 56.13 |
| IR-1 | 20.00 |
| UV-1 | 38.00 |
| Yellow-1 | 12.67 |
| Cyan-2 | 35.00 |

Example 1

Synthesis of 90% 2-methoxyethyl cyanoacrylate/10% methacrylic acid Copolymer

A 125 mL heavy-walled bottle was rinsed with 5% HCl and then dried at 150° C. for 2 h. A stream of nitrogen was run into the bottle while it was cooling and throughout the addition of reagents. Methacrylic acid (2.0 g) was added to the bottle followed by 20 g ethyl acetate and 0.20 g azobisisobutyronitrile (AIBN). The AIBN was allowed to dissolve, followed by addition of 18.0 g 2-methoxyethyl cyanoacrylate. The bottle was sealed with a Teflon seal and an aluminum cap, and then tumbled at 60° C. in a constant temperature bath for 16 h. The resulting polymer solution was diluted to 19% solids using 45 g of tetrahydrofuran (THF), 13 g of ethyl acetate: and 7 g of methanol, and used directly to make dispersions.

Example 2

Preparation of Cyanoacrylate/IR Dye Latex

The copolymer solution from Example 1 was mixed with 14.8 g of ethyl acetate, 22.4 g of THF, 10.0 g of methanol, and 10.0 g of IR-1. Pluronics ® F108 surfactant (BASF Co.) (0.04 g) was dissolved in 105 g water with mild warming over 15 min. The aqueous solution was cooled to 25° C., and 2.42 mL triethylamine was added. The organic phase was poured into a 500 mL plastic bottle and placed under a Silverson homogenizer (Model L4R) with a dispersing head just slightly smaller than the diameter of the bottle. The homogenizer was turned on to ¾ power, and the aqueous solution was added slowly to the organic solution. The resulting dispersion was concentrated by rotary evaporation at 25 mm pressure and at a temperature below 40° C. until no further organic solvents could be removed. The dispersion was filtered successively through 40–60 μm and 10–15 μm porosity glass filters. The resulting dispersion contained 6.89% total solids and 4.58% polymer.

Example 3
Preparation of Aqueous Dispersion of UV-1

In a 30 mL tube, 2.25 g of UV-1, 2,25 g of a 10% aqueous solution of sodium methyl oleoyl taurate surfactant OMT® (Rhone Poulanc Co.), and 10.5 g of water were combined. Approximately 30 mL of zirconium oxide beads (0.35 mm diameter, Zircoa Inc.) were added. The tube was closed tightly, and put on a micro media mill for 90 min. The dispersion was then diluted to 6.6% solids and filtered through a wire screen to remove the beads. The resulting dispersion contained 5.73 % of UV-1.

Example 4
Preparation of Aqueous Dispersion of Yellow-1

In a 30 mL tube, 2.25 g of Yellow-1, 2,25 g of a 10% aqueous solution of sodium methyl oleoyl taurate surfactant OMT®, and 10.5 g of water were combined. The dispersion was milled as in Example 3. The dispersion was then diluted to 10.0% solids and filtered through a wire screen to remove the beads. The resulting dispersion contained 8.73 % of Yellow-1.

Example 5
Preparation of Aqueous Dispersion of Cyan-3

In a 30 mL tube, 2.25 g of Cyan-3, 2,25 g of a 10% aqueous solution of sodium methyl oleoyl taurate surfactant OMT®, and 10.5 g of water were combined. The dispersion was milled as in Example 3. The dispersion was then diluted to 9.25% solids and filtered through a wire screen to remove the beads. The resulting dispersion contained 8.04 % of Cyan-3.

Example 6
Aqueous Coating of Image Recording Layer Containing Cyanoacrylate Binder The support was machine-coated with a mixture of the copolymer/IR-1 latex of Example 2 and the dye dispersions from Examples 3–5 in water to obtain a layer containing the following ingredients:

|  | mg/ft$^2$ |
| --- | --- |
| Polycyanoacrylate | 31.04 |
| IR-1 | 15.52 |
| UV-1 | 32.00 |
| Yellow-1 | 12.50 |
| Cyan-3 | 22.00 |
| Zonyl ® FSN Surfactant (DuPont Corp.) | 0.70 |

Example 7
Aqueous Coating of Image Recording Layer Containing Cyanoacrylate Binder The substrate was machine-coated with a mixture of the copolymer/IR-1 latex of Example 2 and the dye dispersions from Examples 3–5 in water to obtain a layer containing the following ingredients:

|  | mg/ft$^2$ |
| --- | --- |
| Polycyanoacrylate | 31.04 |
| IR-1 | 15.52 |
| UV-1 | 35.20 |
| Yellow-1 | 13.75 |
| Cyan-3 | 24.30 |
| Zonyl ® FSN Surfactant | 0.70 |

Example 8
Alternative Preparation of Aqueous Dispersion of UV-1

16.2 g of UV-1, 5.67 g of sodium methyl oleoyl taurate surfactant OMT® and 86 g of water were combined in a 500 mL jacketed stainless steel vessel with an internal diameter of 80 mm. A 30 mm Cowles-type stirhead was connected to a stir rod and fastened to a high speed mill (Dispersomat). With cold water running thorough the jacket, the mill was turned on to low rev/min to mix the solution to a homogeneous state. Next, 141 g of 50 μm polystyrene/divinylbenzene grinding beads were added to the vessel with slow mixing and allowed to blend in. The blade was positioned about ½ its diameter length above the bottom of the vessel. The mill was run at 1000 rev/min for 10 h. The mixture was diluted to 11 % solids and filtered to separate the grinding media. The resulting dispersion contained 8.15% UV-1.

Example 9
Alternative Preparation of Aqueous Dispersion of Yellow-1

16.2 g of Yellow-1, 5.67 g of sodium methyl oleoyl taurate surfactant OMT®, and 86 g of water were combined in a 500 mL jacketed stainless steel vessel with an internal diameter of 80 mm. The dispersion was milled as in Example 8. The mixture was diluted to 10.3% solids and filtered to separate the grinding media. The resulting dispersion contained 7.64% Yellow-1.

Example 10
Alternative Preparation of Aqueous Dispersion of Cyan-3

13.05 g of Cyan-3, 2.28 g of sodium methyl oleoyl taurate surfactant OMT®, and 69.3 g of water were combined in a 500 ML jacketed stainless steel vessel with an internal diameter of 80 mm. The dispersion was milled as in Example 8 except for 7 hours. An additional 2.28 g of OMT surfactant was added, and the milling was continued for an additional 7 h. The mixture was diluted to 6.66% solids and filtered to separate the grinding media. The resulting dispersion contained 4.93% Cyan-3.

Example 11
Aqueous Coating of Image Recording Layer Containing Cyanoacrylate Binder The substrate was machine-coated with a mixture of the copolymer/IR-1 latex of Example 2 and the dye dispersions from Examples 8–10 in water to obtain a layer containing the following ingredients:

|  | mg/ft² |
| --- | --- |
| Polycyanoacrylate | 31.04 |
| IR-1 | 15.52 |
| UV-1 | 35.20 |
| Yellow-1 | 13.75 |
| Cyan-3 | 24.30 |
| Zonyl ® FSN Surfactant | 0.70 |

Example 12

Imaging Procedure

The image recording layer samples so prepared were imaged with a diode laser imaging device as described in U.S. Pat. No. 4,876,235. The laser beam had a wavelength range of 800–830 nm and a nominal power output of 200 mWatts at the end of the optical fiber. The rotational speed of the drum was varied to produce exposures ranging from approximately 500–800 mJ/cm². The UV density of the imaged regions was measured using an X-Rite® 361T Photographic Densitometer (X-Rite Corp., Grandville, Mich.). The results are shown in the following Table:

TABLE

| | UV OPTICAL DENSITY | | | | |
| --- | --- | --- | --- | --- | --- |
| Exposure (mj/cm²) | Comparative Example 1 | Comparative Example 2 | Example 6 | Example 7 | Example 11 |
| 1004 | 0.075 | 0.0451 | 0.077 | 0.079 | 0.068 |
| 893 | 0.069 | 0.0466 | 0.073 | 0.074 | 0.066 |
| 803 | 0.069 | 0.0477 | 0.071 | 0.074 | 0.054 |
| 730 | 0.069 | 0.0568 | 0.070 | 0.073 | 0.052 |
| 670 | 0.070 | 0.0630 | 0.072 | 0.075 | 0.055 |
| 618 | 0.071 | 0.0857 | 0.074 | 0.079 | 0.059 |
| 574 | 0.072 | 0.1165 | 0.080 | 0.092 | 0.066 |
| 536 | 0.076 | — | 0.089 | 0.109 | 0.089 |

The above data show that the heterogeneous image recording layer of the invention perform as well or better than those of the prior art, but the coating procedure is safer and more environmentally benign.

The invention has been described in detail with particular reference to preferred embodiments thereof, but it will be understood that variations and modifications can be effected within the spirit and scope of the invention.

What is claimed is:

1. A laser ablative recording element comprising a support having thereon a recording layer comprising a pigment dispersed in a polymeric binder, said polymeric binder having an infrared-absorbing material dissolved therein, and wherein said polymeric binder is obtained from an aqueous latex dispersion of a polycyanoacrylate copolymer having the formula:

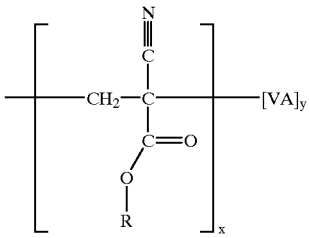

wherein:

R is a substituted or unsubstituted alkyl group having from 1 to about 20 carbon atoms;

VA is a repeating unit resulting from the polymerization of a vinyl-containing monomer with a pendant ionizable group; and the weight ratios of x:y range from about 97:3 to about 70:30.

2. The element of claim 1 wherein VA is —$CH_2CR^1$(COOH)—, wherein $R^1$ is hydrogen or methyl.

3. The element of claim 1 wherein said pendant ionizable group is a carboxylic acid, sulfonic acid or phosphonic acid.

4. A process of preparing the laser ablative recording element of claim 1 comprising:

a) preparing an aqueous latex dispersion of a polycyanoacrylate copolymer and an infrared-absorbing material;

b) preparing an aqueous pigment dispersion;

c) mixing the dispersions from a) and b) together; and d) coating a support with the mixture.

5. The process of claim 4 wherein said aqueous latex dispersion of a polycyanoacrylate copolymer and an infrared-absorbing material is obtained by a) dissolving said copolymer and said infrared-absorbing material in an organic solvent, b) dispersing the solution in water with agitation, and c) removing said organic solvent.

6. The process of claim 5 wherein a base is added during step b).

7. The process of claim 5 wherein a surfactant is added during step b).

8. A process of forming a single color, ablation image comprising imagewise heating by means of a laser, an ablative recording element comprising a support having thereon a recording layer comprising a pigment dispersed in a polymeric binder, said polymeric binder having an infrared-absorbing material dissolved therein, said laser exposure taking place through the recording layer side of said element, and removing the ablated recording layer to obtain said image in said ablative recording element, wherein said polymeric binder is obtained from an aqueous latex dispersion of a polycyanoacrylate copolymer having the formula:

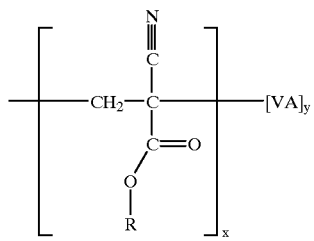

wherein:

R is a substituted or unsubstituted alkyl group having from 1 to about 20 carbon atoms, VA is a repeating unit resulting from the polymerization of a vinyl-containing monomer with a pendant ionizable group, and the weight ratios of x:y range from about 97:3 to about 70:30.

9. The process of claim 8 wherein VA is —$CH_2CR^1$(COOH)—, wherein $R^1$ is hydrogen or methyl.

10. The process of claim 8 wherein said pendant ionizable group is a carboxylic acid, sulfonic acid or phosphonic acid.

* * * * *